(12) United States Patent
Spreitzer et al.

(10) Patent No.: US 7,405,255 B2
(45) Date of Patent: Jul. 29, 2008

(54) SOLUTIONS AND DISPERSIONS OF ORGANIC SEMICONDUCTORS

(75) Inventors: Hubert Spreitzer, Viernheim (DE); Heinrich Becker, Eppstein-Niederjosbach (DE); Kevin Treacher, Northwich (GB); Susanne Heun, Bad Soden (DE); Andreas Sauer, Frankfurt (DE)

(73) Assignee: Merck Patent GmbH (DE)

( * ) Notice: Subject to any disclaimer, the term of this patent is extended or adjusted under 35 U.S.C. 154(b) by 0 days.

(21) Appl. No.: 11/345,263

(22) Filed: Feb. 2, 2006

(65) Prior Publication Data

US 2006/0127592 A1    Jun. 15, 2006

Related U.S. Application Data

(63) Continuation of application No. 10/469,334, filed as application No. PCT/EP02/02491 on Mar. 7, 2002, now Pat. No. 6,994,893.

(30) Foreign Application Priority Data

Mar. 10, 2001    (DE)    ................. 101 11 633

(51) Int. Cl.
  *C08K 5/01*    (2006.01)
(52) U.S. Cl. ............... 524/474; 524/94; 524/97; 524/233; 524/369; 524/462; 524/463; 524/464; 524/465; 524/466; 524/467; 524/468; 524/469; 524/470; 524/476; 427/288; 327/100
(58) Field of Classification Search ............... 524/233, 524/474, 476, 369, 462–470, 94, 97; 523/160; 327/100; 427/288
See application file for complete search history.

(56) References Cited

U.S. PATENT DOCUMENTS

| 3,230,081 | A | * | 1/1966 | Tomanek et al. ............. 430/49 |
| 4,252,880 | A | * | 2/1981 | Lind et al. .................... 430/82 |
| 4,468,291 | A | | 8/1984 | Naarmann et al. |
| 5,079,595 | A | | 1/1992 | Suzuki et al. |
| 5,876,865 | A | | 3/1999 | Hsieh |
| 6,248,818 | B1 | | 6/2001 | Kim et al. |
| 6,458,909 | B1 | | 10/2002 | Spreitzer et al. |
| 6,692,663 | B2 | | 2/2004 | Zhou et al. |
| 2004/0258952 | A1 | | 12/2004 | Haghighat et al. |

FOREIGN PATENT DOCUMENTS

| EP | 0 779 348 | 6/1997 |
| EP | 1 083 775 | 3/2001 |
| WO | WO-00/59267 | 10/2000 |
| WO | WO-01/47045 | 6/2001 |

OTHER PUBLICATIONS

Homer Antoniadis et al., "Light-emitting Diodes Based on Poly(2,3-diphenyl-1,4-phenylene vinylene)", Polymers for Advanced Technologies 8:392-398, XP-002205971 (1997).

T. R. Hebner et al., "Ink-Jet Printing of Doped Polymers for Organic Light Emitting Devices", Appl. Phys. Lett.: 72, No. 5:519-521, XP-000737411 (Feb. 2, 1998).

* cited by examiner

*Primary Examiner*—Peter Szekely
(74) *Attorney, Agent, or Firm*—Connolly Bove Lodge & Hutz LLP

(57) ABSTRACT

The present invention relates to solutions and/or dispersions of organic semiconductors in a solvent mixture of at least two different organic solvents, characterized in that A. Each of the solvents on its own has a boiling point of below 200° C. and a melting point of 15° C. or less,
B. at least one of the solvents has a boiling point in the range from greater than 140 to less than 200° C.,
C. the solvents used have no benzylic $CH_2$ or CH groups,
D. the solvents used are not benzene derivatives containing tert-butyl substituents or more than two methyl substituents, and their use in printing processes for producing layers of organic semiconductors, especially for the electronics industry.

23 Claims, 3 Drawing Sheets

SOLUTIONS AND DISPERSIONS OF ORGANIC SEMICONDUCTORS

RELATED APPLICATIONS

This application is a continuation of application Ser. No. 10/469,334, filed May 20, 2004, which is a 371 of PCT/EP 02/02491, filed Mar. 7, 2002, which claims benefit to German application 101 11 633.0, filed Mar. 10, 2001.

The present invention relates to solutions and/or dispersions of organic semiconductors and to their use in the electronics industry.

In a variety of different applications, which can in the broadest sense be counted as part of the electronics industry, the use of organic semiconductors as active components (=functional materials) has already become reality or is expected in the near future.

Thus, charge transport materials based on organic substances (generally hole transport materials based on triarylamines) have been used in copying machines for some years.

The use of specific semiconducting organic compounds, some of which are also capable of emitting light in the visible spectral region, is just being introduced commercially, for example inorganic or polymeric electroluminescence devices.

The use of organic charge transport layers in applications such as organic integrated circuits (organic ICs) and organic solar cells has, at least in the research stage, progressed so far that introduction onto the market may be expected within the next few years.

The number of further possibilities is very large, although many of these may be regarded only as modifications of the abovementioned processes, for example organic solid-state laser diodes and organic photodetectors.

In some of these modern applications, development has sometimes progressed a long way, but there is, depending on the application, still a tremendous need for technical improvements.

Organic electroluminescence devices and their individual components, viz. organic light-emitting diodes (OLEDs) have already been introduced on the market, as is evidenced by the commercially available automobile radios having an "organic display" from Pioneer. In the case of the high molecular weight variant (viz. polymeric light-emitting diodes, PLEDs), it too, is expected to be introduced commercially in the near future. Nevertheless, significant improvements are necessary here in order to make these displays genuinely competitive with the liquid crystal displays (LCDs) which currently dominate the market or to surpass these.

The general structure of such PLEDs is described in WO 90/13148.

Further embodiments of such PLEDs, e.g. passive matrix addressing, active matrix addressing, are described in the references cited below.

The development of full-color displays is an important direction of development of PLEDs. To be able to achieve such a frill-color display device, it is necessary to develop coating processes which allow the three primary colors (red, green, blue, (RGB)) to be applied physically separately. Since the polymers are applied from solution and/or dispersion, printing processes are the method of choice.

Owing to its good controllability, the achievable resolution and the great variability, work is at present being concentrated on ink-jet printing, (IJP). However, other printing processes, e.g. offset printing, transfer printing or gravure printing, are also suitable in principle.

The inkjet printing process for producing PLEDs and corresponding displays has been described a number of times in the prior art.

The nearest prior art is described below:

EP-A-0880303 described for the first time the principle and the use of IJP for producing PLEDs. According to EP-A-0880303; a solution of an "organic luminescence material" or a solution of a corresponding precursor is applied by means of IJP to a photolithographically prepared substrate which has partitions and an anode.

The use of various solutions enables differently colored pixels to be produced in this way. This patent application tends to teach the principle rather than give technical information as to how the method can be carried out in practice and on the problems to be solved in the process.

Thus, EP-A-0880303 gives no information, apart from three rather dutiful formulations, on the consistency and the preparation of the corresponding solutions. It is only stated that the solutions have to have a contact angle of from 30 to 170° against the material of the nozzle plate of the IJ printing head so that the solution can be printed effectively. Furthermore, the viscosity of the solution should be in the range from 1 to 20 mPa·s (cps) so that, firstly, the concentration of active substance is high enough and, secondly, the solution can still be printed by means of IJP.

Finally, the surface tension of the solution should be in the range from 20 to 70 dyne/cm.

However, this information constitutes no relevant restriction or aid or teaching regarding practical procedures since the broad contact angle range can apply to virtually all solutions or solvents when the nozzle plate is prepared appropriately.

Likewise, the viscosity range indicated begins at virtually pure solvent (for comparison: pure toluene has a viscosity of about 0.6 mPa·s, while Tetralin has a viscosity of about 2 mPa·s) and goes, depending on the molecular weight of the organic compound used, up to very high concentrations.

Finally, the surface tension range indicated constitutes no genuine information or restriction; most usable organic solvents have values in the range indicated; dissolution of polymers does not significantly alter these values.

WO 99/39373 gives, in practical terms, information only on ink jet printing of polyvinylcarbazole solutions doped with dyes. These chloroform-containing solutions lead, according to the patent application, to severe (unsolved) problems in use (OLED): (i) the pixels are inhomogeneous, indicating partial demixing of the dye and the polymer; (ii) the device efficiency is about 50% poorer than that of a light-emitting diode produced without IJP. The unfavorable use properties of chloroform (toxicity, etc.) are well known.

WO 00/59267 highlights for the first time the various problems associated with solutions for preparing organic films or dots by IJP.

Thus, WO 00/59267 describes at least two substantial problems:

Problem 1: Solvents having a vapor pressure which is too high, i.e. having a boiling point which is too low, lead to the IJ solutions drying in the printing head or at the nozzle or on the nozzle plate. As a result, the nozzle can become blocked and the printing process becomes poorly reproducible. Such a system is unsuitable for industrial manufacture.

Problem 2: If the IJ solution comprises various materials (blends), concentration of the IJ solution by evaporation can lead to one of the substances precipitating first. This leads to an inhomogeneous distribution of the various materials in the pixel formed. Such inhomogeneous pixels produce a noticeable deterioration in the properties of the OLED device.

To solve Problem 1 above, WO 00/59267 proposes using solvents having specific property profiles. Substances proposed as suitable solvents are substituted benzene derivatives having at least three carbon atoms in the substituent or substituents. Preference is given to solvents whose boiling point is at least 200° C. The particularly preferred solvent dodecylbenzene has, however, a boiling point of about 300° C.

As a further possible way of solving Problem 1, WO 00/59267 proposes a mixture of at least two solvents of which the first has the abovementioned properties and the second can also have a lower boiling point which is, however, at least 140° C. The description is unclear on this point, since the solvent components mentioned include ones which have a significantly lower boiling point, e.g. toluene (b.p. ~111° C.), chloroform (b.p. ~61° C.) and carbon tetrachloride (b.p. 76° C.).

These solutions comprising the abovementioned solvents or solvent mixtures are said to provide the following problem solutions:

Firstly, the high-boiling solvent prevents drying of the solution in the printing head (solution to Problem 1). To homogenize the pixel (solution to Problem 2) and especially to remove the difficult-to-remove high-boiling solvent, an after-treatment is proposed. In this after-treatment, the substrate or the pixels is/are heated to temperatures in the range from 40 to 200° C. This is firstly carried out under a pressure of from 2 to 100 bar to produce a homogeneous solution again. Heating is subsequently continued under reduced pressure until all solvent has been removed.

The solution proposed in the patent application WO 00/59267 cited here has serious technical problems:

A. It can be seen from Example 1 in the present text that virtually complete removal of the solvent from the coating is essential for good device properties. This complete removal is very difficult in an industrial process in the case of the preferred high-boiling solvents (having a boiling point above 200° C. or dodecylbenzene).

B. No technical information as to why phase separation, i.e. the formation of inhomogeneous pixels, should not still occur during the final solvent evaporation step in the process described is disclosed. The rehomogenization effected earlier could finally be undone again here.

C. The indicated homogenization measures (HIGH PRESSURE, HEATING, VACUUM) are not very suitable for industrial mass production.

D. Several solvents listed in the application have problems per se. Thus, (i) the industrial availability of solvents such as dodecylbenzene, cyclohexylbenzene and other benzenes having large substituents is not assured; (ii) some of the solvents mentioned have undesired reactivities which are disadvantageous for industrial use due to the presence of strongly activated benzylic protons (e.g. in the case of cumene, Tetralin, dodecylbenzene, cf. example 2 of the present text); (iii) some of the solvent components mentioned (e.g. chloroform, carbon tetrachloride) are highly toxic or are suspected of having carcinogenic properties.

In industrial implementation, further problems in addition to the problems 1 and 2 indicated in W000/59267 occur:

Problem 3: Drying of the individual droplets of the IJ solutions on the substrate can lead to the solid substance being homogeneously distributed in the pixel but the layer thickness of the pixel formed varying greatly. In general, the edges of the pixel are significantly higher/lower than the middle of the pixel.

This then leads in the application, viz. the PLED, to there being an inhomogeneous luminous intensity within the pixel and the various regions of the pixel degrading at different rates.

Problem 4: If the solution in the printed pixels dries too slowly, movement of the substrate (in industrial IJPs, the substrate is generally conveyed in one direction with the printing head moving perpendicular thereto) can result in solution flowing over the pixel boundary (the pixels are generally bounded by photolithographically produced walls). There are also IJP processes in which the substrate moves in both directions and the printing head remains stationary. In this case, the effect is even Mixing of the inks has a particularly adverse effect when it results in pixel solutions of different colors mixing. The undesirable layer thickness variations and the resulting inhomogeneities lead to non reproducible emission behavior.

Problem 5: As indicated above, it is necessary for the solvent to be removed virtually completely from the deposited film in order to obtain optimum device properties. If the vapor pressured of the solvent is too low (boiling point too high), this results in appreciable problems.

All these problems (1 to 5) have not been satisfactorily solved to date.

It is therefore an object of the present invention to provide a technical improvement in respect of the above-described problems.

The invention provides solutions and/or dispersions of organic semiconductors, in particular polymeric organic semiconductors, in a solvent mixture of at least two different organic solvents, characterized in that.

(1) Each of the solvents on its own has a boiling point below 200° C. and a melting point of 15° C. or less,
(2) at least one of the solvents has a boiling point in the range from greater than 140 to less than 200° C.,
(3) the solvents used have no benzylic $CH_2$ or CH groups,
(4) the solvents used are not benzene derivatives containing tert-butyl substituents or more than two methyl substituents.

The invention further provides for the use of the solutions and/or dispersions of the invention for producing layers of the organic semiconductors, in particular polymeric organic semiconductors, on a substrate.

A preferred embodiment is the use of printing processes for producing organic semiconductor layers. Particular preference is given to the use of ink jet printing (IJP).

The invention also provides the layers of the organic semiconductors produced using the solutions and dispersions of the invention.

Figure 1:
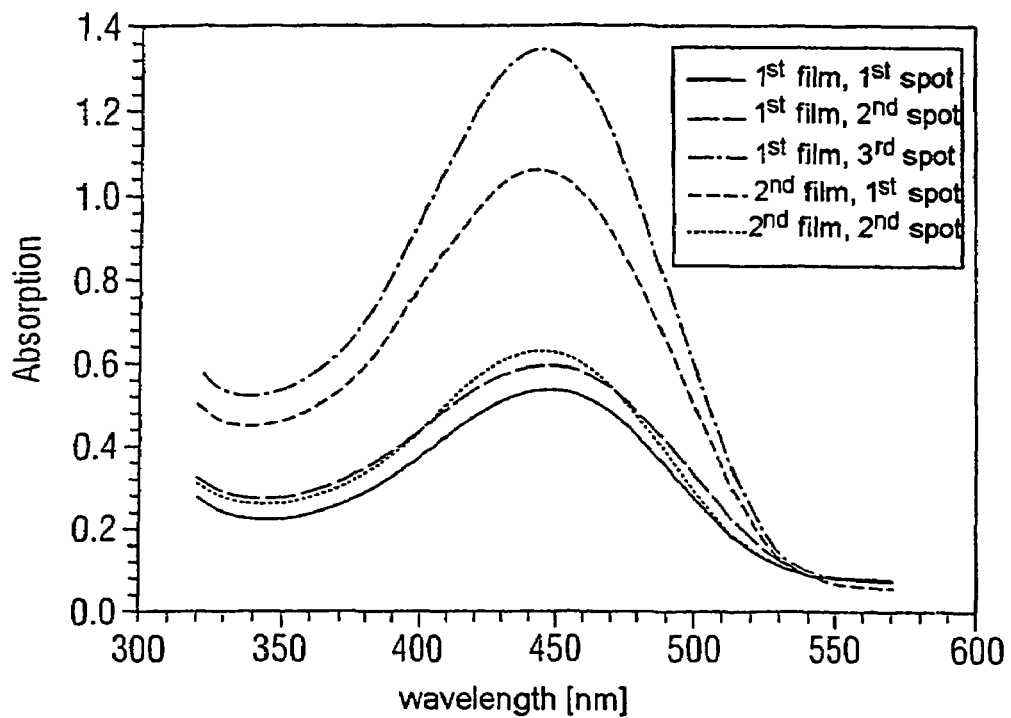
FIG. 1 shows the absorption spectra of, two polyarylenevinylene films (polymer a, cf. table 2) which were produced in an identical manner by spin coating a glass substrate having dimensions of 3×3 cm with a tetralin solution.

Layers of the organic semiconductors known per se have been described in the literature. The layers produced by means of the solutions or dispersions of the invention display improved morphological properties compared with those described hitherto. In particular, the homogeneity of the layer, for example when using blends or mixtures of organic semiconductors, the constancy of the layer thickness over the coated surface (e.g. the individual pixel) and the freedom from pin-holes (microscopic holes in the semiconductor layer which can nevertheless lead to fatal device damage) are significantly improved by the improved use properties of the solutions and dispersions of the invention.

For the purposes of the present text, solutions are mixtures of solid substances with solvents which are liquid and in which the solids are molecularly dissolved, i.e. the great majority of the solid molecules are actually dissolved and not present in the form of aggregates or nanoparticles or microparticles.

For the purposes of the present text, dispersions are mixtures of solid substances in solvents which are liquid and in which the solids are not molecularly dissolved, i.e. the great majority of the solid molecules are not present in dissolved form but in the form of aggregates or nanoparticles or microparticles.

The viscosity of the solutions and/or dispersions of the invention is variable. However, certain coating techniques require the use of particular viscosity ranges. Thus, for coating via IJP, a range of from about 4 to 25 mPa·s is appropriate. However, in the case of other printing methods, e.g. gravure printing, a significantly higher viscosity, for example in the range from 20 to 500 mPa·s, can give advantages.

Organic semiconductors for the purposes of the present text are organic or organometallic compounds which, as solid or as consolidated layer, have semiconducting properties, i.e. they have an energy gap between conduction band and valence band in the range from 10.1 to 4 eV.

The organic semiconductors used in the solutions and/or dispersions of the invention are subject to no particular restriction. According to the invention, both low molecular weight organic semiconductors and polymeric semiconductors can be used.

Examples of organic semiconductors used in the solutions and/or dispersions of the invention are low molecular weight organic semiconductors based on triarylamines (Proc. SPIE-Int. Soc. Opt.: Eng. 1997, 3148, 306-312), aluminum tris(8-hydroxyquinoline) (Appl. Phys. Lett. 2000, 76(1), 115-117), pentacenes (Science 2000, 287(5455), 1022-1023), oligomers (Opt. Mater. 1999, 12(2/3), 301-305), further fused aromatic systems (Mater. Res. Soc. Symp. Proc. 2000, 598, BB9.5/1-BB9.5/6) and further compounds as are described, for example, in J. Mater. Chem. 2000, 10(7), 1471-1507, and Handb. Adv. Electron. Photonic Mater. Devices 2001, 10, 1-51. The low molecular weight semiconductors disclosed in the abovementioned references are hereby incorporated by reference into the present description.

However, polymeric organic or organometallic semiconductors are preferably used in the solutions or dispersions of the invention.

Very particular preference is given to solutions according to the invention of polymeric organic semiconductors.

For the purposes of the present description, polymeric organic semiconductors are, in particular, (i) the substituted poly-p-arylene-vinylenes (PAVs) which are soluble in organic solvents and are disclosed in EP-A-0443861 which corresponds to U.S. Pat. Nos. 5,317,169 and 5,726,457, WO 94/20589 which corresponds to U.S. Pat. Nos. 5,189,136 and 5,679,757, WO 98/27 136 which corresponds to U.S. Pat. No. 6,458,909, BP-A-1025 183, WO 99/24526 which corresponds to U.S. Pat. No. 6,638,646 and U.S. Publication No. 2002064680, DE-A-19953806 and EP-A-0964045 which corresponds to U.S. Pat. No. 6.403,237, (ii) the substituted polyfluorenes (PFs) which are soluble in organic solvents and are disclosed in EP-A-0842208 which corresponds to U.S. Pat. Nos.5,708,130; 5,962,631; 6,169,163; 6,255,447; 6,255, 449; 6,309,763 and 6,362,310, WO 00/22027 which corresponds to U.S. Pat. No. 6,541,602,WO 00/22026 which corresponds to U.S. Pat. Nos. 6,653,438. PE-A-19981010, WO 00/46321 which corresponds to U.S. Pat. No. 6,353,083, WO 99/54385 which corresponds to U.S. Pat. Nos. 5,708,130; 5,962,631; 6,169,163; 6,255,447: 6,255,449; 6,309,763 and 6,362,310, WO 00/55927 which corresponds to U.S. Pat. Nos. 6,512,082; 6,858,324; 6,861,502, and U.S. publication Nos. 2003153725; US 2003 186079; 2004075381; 2005064231; (iii) the substituted polyspirobifluorenes (PSFs) which are soluble in organic solvents and are disclosed in EP-A-0707020 which corresponds to U.S. Pat. No. 5,621,131, WO 96/17036 which corresponds to U.S. Pat. No. 5,741,921, WO 97/20877 which corresponds to U.S. Pat. Nos. 6,132,641; 6380445 and 6559277, WO 97/3 1048 which corresponds to U.S. Pat. No. 6,361,884, WO 97/39045 which corresponds to U.S. Pat. No. 5,576,636, (iv) the substituted poly-para-phenylenes (PPPs) which are soluble in organic solvents and are disclosed in WO 92/18552 which corresponds to U.S. Pat. No. 5,679,760, WO 95/07955 which corresponds to U.S. Pat. No. 5,856,434, EP-A-0690086 which corresponds to U.S. Pat. No. 5,712,361, EP-A-0699699 which corresponds to U.S. Pat. No. 5,728,480, (v) the substituted polythiophenes (PTs) which are soluble in organic solvents and are disclosed in EP-A-1028136 which corresponds to U.S. Pat. No. 6,166,172, WO 95/05937 which corresponds to U.S. Pat. No. 5,965,241, (vi) the polypyridines (PPys) which are soluble in organic solvents and are disclosed in T. Yamamoto et al., J. Am. Chem. Soc. 1994, 116, 4832, (vii) the polypyrroles which are soluble in organic solvents and are disclosed in V. Gelling et al., Polym. Prepr 2000, 41, 1770, (viii) substituted, soluble copolymers comprising structural units of two or more of the classes (i) to (vii), (ix) the conjugated polymers which are soluble in organic solvents and are disclosed in Proc. of ICSM '98, Part I & II (in: Synth. Met. 1999, 101 +102), (x) substituted and unsubstituted polyvinylcarbazoles as are disclosed, for example, in R. C. Penwell et al., J. Polym. Sci., Macromol. Rev. 1978, 13, 63-160, and (xi) substituted and unsubstituted triarylamine polymers as we disclosed, for example, in JP 2000-072722. These polymeric organic semiconductors are hereby incorporated by reference into the disclosure of the present invention.

The polymeric organic semiconductors used for the purposes of the present invention can also be used in doped form and/or as a blend with one another.

The solutions and dispersions of the invention contain from 0.01 to 20% by weight, preferably from 0.1 to 15% by weight, particularly preferably from 0.25 to 10% by weight, very particularly preferably from 0.25 to 5% by weight, of the organic semiconductors. According to the invention, it is also possible to use a mixture/blend of more than one semiconductor.

In addition, as described above, the solutions and dispersions of the invention comprise at least two different solvents of which at least one has a boiling point above 140 and below 200° C. It is preferred that the solvents have different boiling points; the difference in the boiling points is particularly preferably more than 10° C. and very particularly preferably more than 20° C.

The ratio of the two solvents to one another can be varied within a wide range.

However, to achieve significant effects, the (volume) ratio of the two solvents used 0.5 should be in the range from 1:99 to 99:1, preferably in the range from 0.1, 0:90 to 90:10, particularly preferably in the range from 20:80 to 80:20.

These mixtures display surprising improvements in the abovementioned problem areas.

Thus, the presence of the solvent having a boiling point above 140 and below 200° C. leads to the solutions/dispersions not drying too quickly in the printing head/at the nozzles (Problem 1). Although even higher-boiling solvents are even better here, these then have disproportionately great disadvantages, particularly in respect of problems 3 to 5. It has been found that a significant improvement can be achieved using solvents having this boiling point range:

A. In respect of Problem 3, it is distinctly better to have lower-boiling solvents, since more rapid evaporation leads more quickly to a high viscosity in the pixel so that such effects do not occur at all. This is promoted particularly by solvent mixtures made up of solvents having different boiling points, since the lower-boiling solvent evaporates even more quickly and this effect is reinforced (example 4).

B. Problem 4 and Problem 5 are for the same reason solved significantly better than when using solvents having boiling points which are too high.

C. Even in respect of Problem 2, it has been found (cf. Example 5) that significantly accelerated drying of the pixels has an advantageous effect. Demixing can obviously be avoided virtually entirely as a result of the rapid thickening. This finding was surprising.

Problems 2 and 5 could naturally also be solved in principle by the use of truly low-boiling solvents (or solvent mixtures). However, these present difficulties in respect of Problem 1 which cannot be solved industrially. Thus, solvents in the range indicated provide an optimum solution for the two problem areas. Problems 1 to 5 in combination cannot be solved effectively by means of a single solvent. If the solvent used has a boiling point which is too low, Problem 1 cannot be solved, but if the solvent used has a boiling point which is too high, Problems 3 to 5 become increasingly difficult to solve.

The solvent mixtures of the invention therefore have been found to give surprisingly simple and effective improvements.

The boiling point limited of 200° C. appears at first glance to be somewhat arbitrary, but constitutes a technically sensible limit according to the present invention. In the case of solvents above this limit (e.g. Tetralin, cf. Example 1 cyclohexylbenzene, n-pentylbenzene), especially problems 3 and 4 (thickening takes too long) and finally, (if this: problem has been alleviated by means of a mixture) Problem 5 (complete removal of the solvents from the film) become technically difficult to alleviate.

The solvents used should have a melting point of 15° C. or below because the solutions or dispersions may have to be stored for days or months (between production and use) and possibly also transported. In this case, it has to be ensured that the solutions or dispersions remain stable as such and do not freeze during storage and/or transport or display other disadvantageous effects on storage and/or transport.

The solution or dispersion of the invention has to comprise at least one solvent having a boiling point of above 140° C. For the purposes of the present text, the boiling point is the boiling point under atmospheric pressure (1013 mbar). This limit is imposed since it has been found in practice that drying of the nozzles takes place within a few seconds after the end of printing when solvents having lower boiling points are used. As soon as this time is about 10 seconds or above drying out can be prevented by appropriate technical measures (printing head moves to the standby position, nozzles are mechanically closed by a cap).

Thus, the use of at least one solvent having a boiling point between 140 and 200° C. is important for achieving the effects according to the invention.

When solvents containing benzylic $CH_2$ or CH groups are used, the solution or dispersion obtained has an extremely low stability and is unsuitable for industrial mass production. In this respect, some of the solvents recommended in WO 00/59267 (e.g. Tetralin, dodecylbenzene, cumene and further similar solvents) are not helpful in solving the problems described above. For example, it: has been found (cf. Example 2) that a Tetralin solution of a PPV derivative suffers from a significant change in properties (decrease in viscosity, decrease in the molecular weight of the polymer, deterioration in the device properties in the production of PLED displays) within a few weeks (despite storage under protective gas and in the absence of light). Similar results have been obtained, inter alia, using cumene, 2-butylbenzene and n-butylbenzene.

The use/concomitant use of solvents which bear such groups in the side groups is therefore undesirable, since it leads to a significant deterioration in properties.

The use of solvents having a large number of aromatic methyl groups or at least one tert-butyl group has been found to be problematical in so far as many polymeric semiconductors have been found to have a poor solubility in such solvents. This is demonstrated in Example 3.

Naturally, such an overview and such a study cannot be comprehensive, but the trend can clearly be seen. To avoid making the invention unnecessarily difficult to perform, benzene-type solvents having more than two methyl groups or at least one tert-butyl group are ruled out for the purposes of the invention.

This physicochemically practical embodiment firstly solves the problems underlying the invention and secondly provides a technically sensible delineation from the solutions of the above-cited prior art or WO 00/59267.

The following solvents having boiling points between 140 and 200° C., inter alia, are then suitable for the solutions of the invention. These solvents are, in particular, substituted and unsubstituted xylene derivatives, di-C1-C2-alkylformamides, substituted and unsubstituted anisoles, further phenol ether derivatives, substituted heterocycles such as substituted pyridines, pyrazines, pyrimidines, pyrrolidinones, substituted and unsubstituted N,N-di-$C_1$-$C_2$-alkylanilines and further fluorinated or chlorinated aromatics.

Particular preference is given to the solvents having boiling points between 140 and 200° C. listed in the following table.

| Solvent | CAS number | Boiling point [° C.] | Melting point [° C.] | Miscellaneous e.g. flash point, flp.) |
|---|---|---|---|---|
| 1 o-Xylene | 95-47-6 | 144 | −24 | flp. 32° C. |
| 2 2,6-Lutidine | 108-48-5 | 145 | −6 | flp. 33° C. |

-continued

| | Solvent | CAS number | Boiling point [° C.] | Melting point [° C.] | Miscellaneous e.g. flash point, flp.) |
|---|---|---|---|---|---|
| 3 | 2-Fluoro-m-xylene | 443-88-9 | 147 | n.a. | flp. 30° C. |
| 4 | 3-Fluoro-o-xylene | 443-82-3 | 150 | n.a. | flp. 36° C. |
| 5 | 2-Chlorobenzotrifluoride | 88-16-4 | 152 | −7 | flp. 58° C. |
| 6 | Dimethylformamide | 68-12-2 | 153 | −61 | flp. 57° C. |
| 7 | 2-Chloro-6-fluoro-toluene | 443-83-4 | 154 | −27 | flp. 46° C. |
| 8 | 2-Fluoroanisole | 321-28-8 | 154 | −39 | flp. 60° C. |
| 9 | Anisole | 100-66-3 | 154 | −37 | flp. 51° C. |
| 10 | 2,3-Dimethylpyrazine | 5910-89-4 | 156 | n.a. | flp. 54° C. |
| 11 | 4-Fluoroanisole | 459-60-9 | 157 | −45 | flp. 43° C. |
| 12 | 3-Fluoroanisole | 456-49-5 | 160 | −35 | flp. 43° C. |
| 13 | 3-Trifluoromethyl-anisole | 454-80-0 | 160 | −65 | flp. 48° C. |
| 14 | 2-Methylanisole | 578-58-5 | 170 | −34 | flp. 51° C. |
| 15 | Phenetole | 103-73-1 | 170 | −30 | flp. 57° C. |
| 16 | 4-Methylanisole | 104-93-8 | 174 | −32 | flp. 53° C. |
| 17 | 3-Methylanisole | 100-84-5 | 175 | −55 | flp. 54° C. |
| 18 | 4-Fluoro-3-methyl-anisole | 2338-54-7 | 175 | n.a. | flp. 62° C. |
| 19 | 2-Fluorobenzonitrile | 394-47-8 | ~180 | n.a. | flp. 73° C. |
| 20 | 4-Fluoroveratrole | 398-62-9 | ~180 | n.a. | n.a. |
| 21 | 2,6-Dimethylanisole | 1004-66-6 | 182 | n.a. | flp. 67° C. |
| 22 | 3-Fluorobenzonitrile | 403-54-3 | 185 | −16 | flp. 67° C. |
| 23 | 2,5-Dimethylanisole | 1706-11-2 | 190 | ~5 | flp. 66° C. |
| 24 | 2,4-Dimethylanisole | 6738-23-4 | 191 | n.a. | flp. 63° C. |
| 25 | Benzonitrile | 100-47-0 | 191 | −13 | flp. 71° C. |
| 26 | 3,5-Dimethylanisole | 874-63-5 | 193 | n.a. | flp. 65° C. |
| 27 | N,N-Dimethylaniline | 121-69-7 | 194 | 2 | flp. 62° C. |
| 28 | 1-Fluoro-3,5-dimethoxybenzene | 52189-63-6 | ~195 | n.a. | n.a. |
| 29 | N-Methylpyrrolidinone | 872-50-4 | 199 | −24 | flp. 86° C. |

The solvents listed in the table make no claim as to completeness. The preparation of a solution or dispersion according to the invention can naturally also be carried out readily by a person skilled in the art using further solvents which are not explicitly mentioned here but have boiling points in the range indicated without needing to make an inventive step.

However, the use of, for example, purely aliphatic solvents (frequently insufficient solubility or dispersibility), aldehyde- or ketone-containing solvents+nitrated aromatics, phosphorus-containing solvents (insufficient stability of the solutions or dispersions) and of styrene derivatives or other reactive olefins (tendency of the solvents to polymerize) has been found to be not advantageous.

Many solvents having boiling points below 140° C. are suitable for the solutions of the invention.

In the case of the solvents having a boiling point below 140° C. to be used according, to the invention, the restrictions mentioned above for solvents having boiling points between 140 and 200° C. (no aliphatics, olefins, aldehydes, ketones, nitro and phosphorus compounds) once again apply. Furthermore, a very low boiling point is inadvisable, since this makes it difficult to solve Problem 1 despite the use of the solvent mixture.

Preference is therefore given to using only solvents having a boiling point of at least 100° C. and below 140° C. in the solutions or dispersions of the invention.

A further technical restriction which has already been virtually circumvented by this preference is the avoidance of highly toxic solvent or solvents which have been proven to be carcinogenic, for example chloroform (boiling point ~61° C.), tetrachloromethane (boiling point ~77° C.) and benzene (boiling point ~80° C.).

The following solvents having a boiling point below 140° C., inter alia, are suitable for the solutions of the invention.

These are, in particular, fluorinated or chlorinated aromatics or heteroaromatics, e.g. benzene, toluene, xylene and pyridine derivatives, and also derivatives of ethers and cyclic ethers.

Very particular preference is given to the selected solvents having boiling points below 140° C. shown in the following table, which have displayed good solvent or dispersing properties for organic semiconductors, especially polymeric organic semiconductors.

| | Solvent | CAS number | Boiling point [° C.] | Melting point [° C.] | Miscellaneous (e.g. flash point, flp.) |
|---|---|---|---|---|---|
| 1 | 3-Fluorobenzotrifluoride | 401-80-9 | 102 | −81 | flp. 7° C. |
| 2 | Benzotrifluoride | 98-08-8 | 102 | −29 | flp. 12° C. |
| 3 | Dioxane | 123-91-1 | 102 | 12 | flp. 12° C. |
| 4 | Trifluoromethoxy-benzene | 456-55-3 | 102 | −50 | flp. 12° C. |
| 5 | 4-Fluorobenzotrifluoride | 402-44-8 | 103 | −41 | flp. 7° C. |
| 6 | 3-Fluoropyridine | 372-47-4 | 108 | n.a. | flp. 13° C. |
| 7 | Toluene | 108-88-3 | 111 | −93 | flp. 4° C. |
| 8 | 2-Fluorotoluene | 95-52-3 | 113 | −62 | flp. 12° C. |
| 9 | 2-Fluorobenzotrifluoride | 392-85-8 | 115 | −51 | flp. 17° C. |
| 10 | 3-Fluorotoluene | 352-70-5 | 115 | −87 | flp. 9° C. |
| 11 | Pyridine | 110-86-1 | 115 | −42 | flp. 20° C. |

-continued

| | Solvent | CAS number | Boiling point [° C.] | Melting point [° C.] | Miscellaneous (e.g. flash point, flp.) |
|---|---|---|---|---|---|
| 12 | 4-Fluorotoluene | 352-32-9 | 116 | −56 | flp. 17° C. |
| 13 | 2,5-Difluorotoluene | 452-67-5 | 120 | −35 | flp. 12° C. |
| 14 | 1-Chloro-2,4-difluorobenzene | 1435-44-5 | 127 | −26 | flp. 32° C. |
| 15 | 2-Fluoropyridine | 372-48-5 | 127 | n.a. | flp. 28° C. |
| 15 | 3-Chlorofluorobenzene | 625-98-9 | 127 | n.a. | flp. 20° C. |
| 15 | 1-Chloro-2,5-difluorobenzene | 2367-91-1 | 128 | −25 | flp. 20° C. |
| 16 | 4-Chlorofluorobenzene | 352-33-0 | 130 | −27 | flp. 29° C. |
| 17 | Chlorobenzene | 108-90-7 | 132 | −45 | flp. 23° C. |
| 18 | 2-Chlorofluorobenzene | 348-51-6 | 138 | −42 | flp. 31° C. |
| 19 | p-Xylene | 106-42-3 | 138 | 12 | flp. 25° C. |
| 20 | m-Xylene | 108-38-3 | 139 | −47 | flp. 25° C. |

The solvents listed in this Table, too, are naturally not to be regarded as a restriction, but only as sensible technical advice. It is naturally also possible to use further solvents which also have favorable properties (solubility, boiling point, miscibility, to name only a few) for the solutions and dispersions of the invention.

Preference is thus given to solutions and dispersions of the invention comprising one or more solvents having a boiling point above 140° C. selected from among o-xylene, 2,6-lutidine, 2-fluoro-m-xylene, 3 -fluoro-o-xykne, 2-chlorobenzotrifluoride, dimethylformamide, 2-chloro-6-fluorotoluene, 2-fluoroanisole, anisole, 2,3-dimethylpyrazine, 4-fluoroanisole, 3-fluoroanisole, 3-trifluoromethylanisole, 2-methylanisole, phenetole, 4-methylanisole, 3-methylanisole, 4-fluoro-3-methylanisole, 2-fluorobeuzonitrile, 4-fluoroveratrole, 2,6-dimethylanisole, 3- fluorobenzonitrile, 2,5-dimethylanisole, 2,4-dimethylanisole, benzonitrile, 3 ,5-dimethyhnisole, N,N-dimethylaniline, 1-fluoro-3,5-dimethoxybenzene or N-methylpyrrolidinone.

Furthermore, preference is likewise given to solutions and dispersions according to the invention comprising one or more solvents having2 a boiling point below 140° C. selected from among 3-fluorobenzotrifluoride, benzotrifluoride, dioxane, trifluoromethoxybenzene, 4-fluorobenzotrifluoride, 3-fluoropyridine, toluene, 2-fluorotoluene, 2-fluorobenzotrifluoride, 3-fluorotoluene, pyridine, 4-fluorotoluene, 2,5-difluorotoluene, I-chloro-2,4-difluorobenzene, 2-fluoropyridine, 3-chlorofluorobenzene, 1-chloro-2,5-difluorobenzene, 4-chlorofluorobenzene, chlorobenzene, 2-chlorofluorobenzene, p-xylene or m-xylene.

In a preferred embodiment of the solutions and dispersions of the invention, these thicken and gel very quickly when they partly dry (become concentrated).

This effect is particularly preferably employed in the case of solutions of polymeric organic semiconductors.

In this context, "very quickly" means that it occurs more quickly than if simple physical laws were just being followed. Thus, the following relationship between viscosity q and concentration c:

$$\eta \sim c^{3.4}$$

frequently applies to polymer solutions.

This indicates that a doubling of the concentration produces an approximately 10-30 fold increase in the viscosity. Above a certain point, the solution then gels, i.e. it no longer flows properly.

Thus, "very quickly" means that when the concentration doubles, as occurs on partial drying of a printed film, the viscosity is increased by a factor of more than 10, or at least more quickly than would normally occur in the case of a solution in a solvent.

This can surprisingly be found in the case of the solutions of the invention in a preferred embodiment.

If mixtures of at least two solvents in which the polymeric organic semiconductor is soluble are prepared, the following prerequisites generally have to be met to obtain this overproportional increase:

The viscosity of the solution of the polymer in solvent 1 (lower boiling point) is equal to less than that of a solution of the polymer in solvent 2.

On concentrating a mixture, the mixture then becomes enriched in solvent 2. This results not only in the concentration effect but also a transition to a solution having an (intrinsically) higher viscosity.

An advantage of such a preferred solution according to the invention is that the above-described problems 2 to 5 can be solved very well in this way.

A further preferred embodiment then provides for the use of a solution comprising at least three solvents. The "very rapid" thickening just mentioned can be increased further in this way.

The invention therefore also provides a solution or dispersion according to the invention, characterized in that at least three different solvents are used.

It has in this case been found to be particularly advantageous to use three solvents having different boiling points.

It is advantageous to use a solvent A having a comparatively low boiling point (100-150° C.), a further solvent B having an intermediate boiling point (130-180° C.) and a third solvent C having a high boiling point (from 170 to below 200° C.).

A solution or dispersion should then be very thick or even gel-like in the last of the solvents. An extremely rapid increase in viscosity then takes place when the solution is concentrated.

As in the case of the use of two solvents, the (volume) ratio of the solvents can vary within a wide range in this case, too.

A: 1-70%, preferably 10-70%
B: 1-90%, preferably 10-70%
C: 1-60%, preferably 10-50%

The total percentage of the solvent mixture is naturally always 100%.

In the case of solvent mixtures of three or more solvents, one of the solvents can also be nonorganic, preferably water, in one variant. This further nonorganic solvent, preferably water, is, however, only used in small amounts. When water is used, the simple residual moisture of solvent which has not evaporated may be sufficient to alter the properties of the solutions or dispersions.

In the present text and also in the further examples below, the composition or use of solutions or dispersions according to the invention is mostly targeted at polymeric light-emitting diodes and the corresponding displays. Despite this restriction of the description, a person skilled in the art can readily, without any further inventive step, prepare and use solutions or dispersions according to the invention for use also in other devices, e.g. organic integrated circuits (O-ICs), organic field effect transistors (OFETs), organic thin film transistors (OTFTs), organic solar cells (O-SCs) or organic laser diodes (O lasers), to name only a few applications.

The present invention is illustrated by the following examples without being restricted thereto. On the basis of the description and the examples described, a person skilled in the art can, without any inventive step, prepare additional solutions or dispersions according to the invention and use these to produce layers therefrom.

EXAMPLE 1

Figure 2:
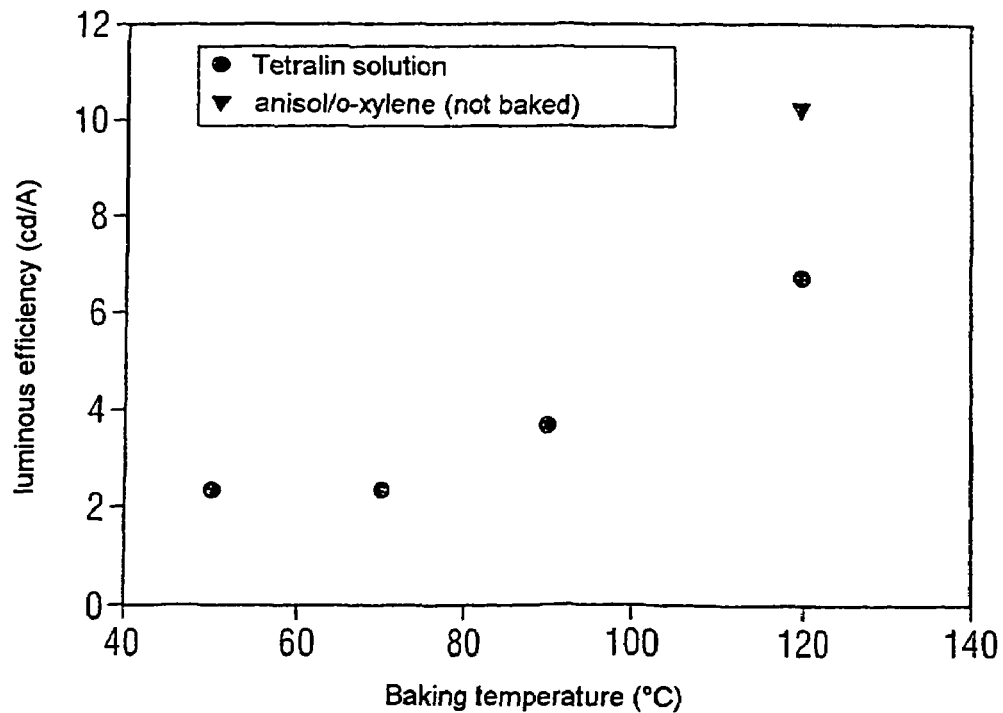
FIG. 2 illustrates the residual solvent content. The residual solvent content remains so great that the efficiencies of polymeric light-emitting diodes produced from tetralin did not reach those produced from anisole/o-xylene (v:v=1:1)

Comparative Examples: Film Formation and Device Properties Using Solutions in Tetralin The use of only one solvent which could solve Problem 1 (excessively rapid drying of the solution in the printing head), e.g. Tetralin, leads to the occurrence of problems 3 to 5 in film formation. Absorption spectra allow the measurement of layer thicknesses by application of the Lambert-Beer Law ($E=\epsilon$ c d). FIG. 1 shows the absorption spectra of, two polyarylene-vinylene films (Polymer A, cf. Table 2) which were produced in an identical manner by spin coating a glass substrate having dimensions of 3×3 cm with a Tetralin solution. The film thicknesses vary by a factor of 2 even on a single substrate. To obtain homogeneous films, the films had to be left on the spin coater for 12 minutes and then baked at 120° C. for 10 minutes. In printing processes, the slow drying led to the difficulties addressed above (Problem 4). Despite the long drying time, the residual solvent content remains so great that the efficiencies of polymeric light-emitting diodes produced from Tetralin did not reach those produced from anisole/o-xylene (v:v=1:1) (cf. FIG. 2).

EXAMPLE 2

Comparative Examples: Storage Stability of Polymer Solutions

Solution of polymer A in Tetralin (Solution 1)
Solution of Polymer A in cumene (Solution 2)
Solution of Polymer A in anisole/o-xylene (v:v=1:1) (Solution 3)
(Note: Polymer A; cf. Table 2 under Example 3)

The solutions were all prepared in parallel and in the same way. For this purpose, the solid polymers (about 7.5 g/l) were dissolved at about 65° C. under protective gas for about 30 hours, filtered and stored under protective gas in tightly closed containers.

The properties of the solutions were examined immediately after filtration (Solutions 1, 2, 3) and 90 days later (Solutions 1a, 2a, 3).

The results obtained are summarized in Table 1.

TABLE 1

Comparison of the storage stability of various polymer solutions in different solvents.

| Solution | Viscosity [mPa * s] at 40 s$^{-1}$ | Molecular weight $M_w$, $M_n$ (/1000) [u] | Layer thickness on preparation of a film [nm] | Electroluminescence Maximum efficiency [Cd/A]; Voltage @ 100 Cd/m$^2$ [V] |
|---|---|---|---|---|
| 1 | 13.0 | 340, 200 | 75 | 6.5 Cd/A; 3.5 V |
| 1a | 8.9 | 210, 100 | 45 | 4.5 Cd/A; 4.2 V |
| 2 | 12.5 | 330, 210 | 75 | 8.5 Cd/A; 3.3 V |
| 2a | 7.5 | 200, 90 | 40 | 4.2 Cd/A; 3.9 V |
| 3 | 12.0 | 370, 210 | 75 | 10.5 Cd/A; 3.2 V |
| 3a | 11.9 | 375, 210 | 75 | 10.7 Cd/A; 3.4 V |

The solutions in Tetralin (1, 1a) and cumene (2, 2a) displayed only a low storage stability. It is clear that in each case the use properties deteriorated dramatically and direct degradation of the polymer was found.

It may be assumed that this is attributable to small traces of peroxides in the respective solvents, even though the solvents had been, as is customary for those skilled in the art, dried (over LiAlH$_4$), freed of peroxides and ketones and distilled via a packed column and subsequently stored under protective gas. However, GC/MS analysis of Tetralin indicated that approximately similar amounts of Tetralin and tetralol were present before purification and afterwards. Unfortunately, it may be assumed that the situation regarding Tetralin hydroperoxide is similar.

In contrast, the solvent mixture according to the invention (solutions 3, 3a) displayed no signs of such degradation. Furthermore, primary use properties (efficiency and voltage) when employed in PLEDs were significantly better . . . .

EXAMPLE 3

Comparative Example: Solubility of Two Conjugated Polymers in Various Solvents

Various solutions (concentration in this case: about 5 g/l) were prepared using a method similar to that of Example 2, and in this case the solution consistency was measured directly.

Figure 3:
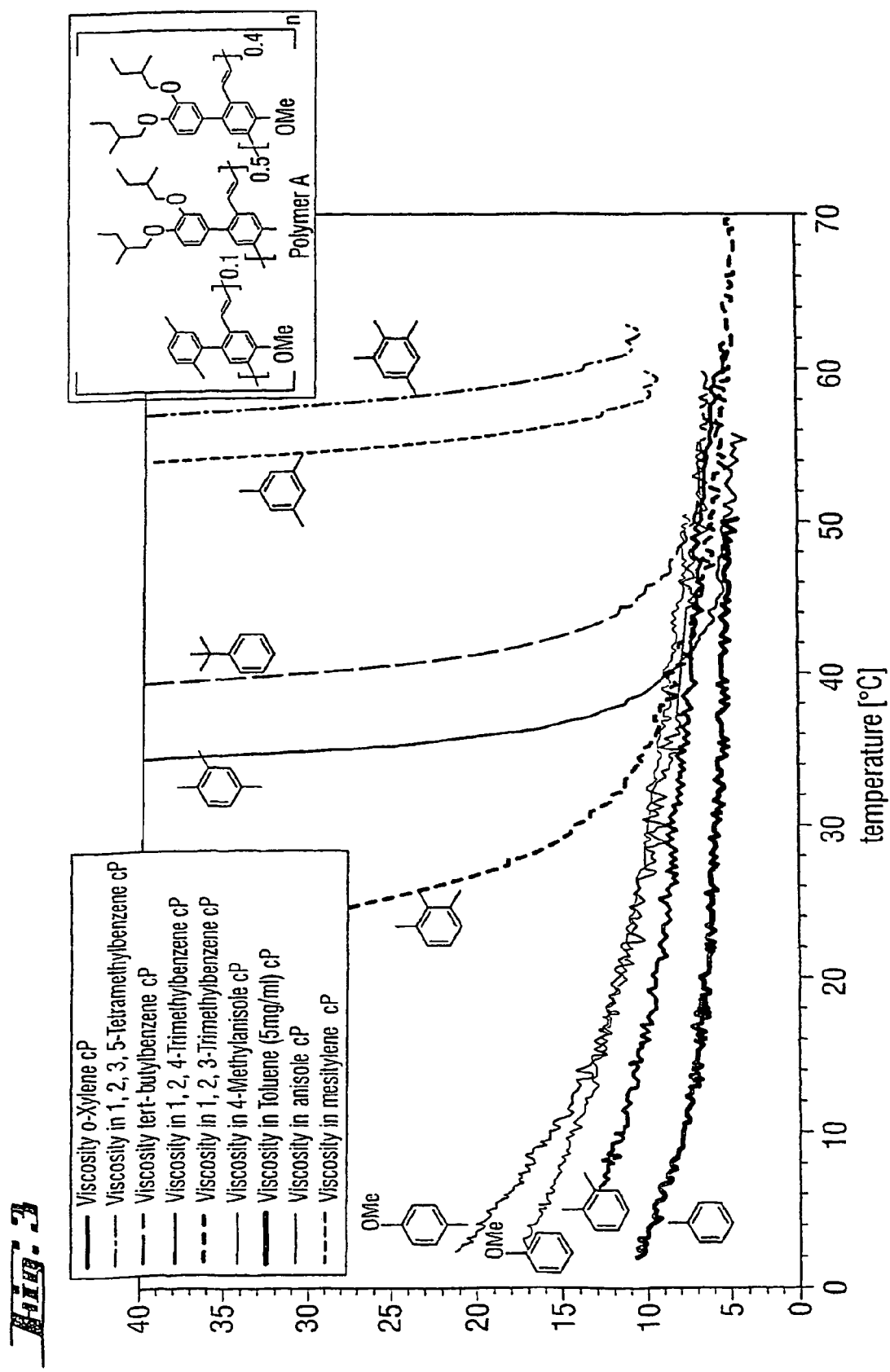
FIG. 3 illustrates the individual gel curves (viscosity as a function of temperature) and the respective behavior better.

The results are summarized in Table 2. In the case of Polymer A, the individual gel curves (viscosity as a function of temperature) are also depicted in FIG. 3 to illustrate the respective behavior better.

TABLE 2

| Solvent | Solution behavior Polymer A | Solution behavior Polymer B |
|---|---|---|
| 1,2,3-Trimethylbenzene | Gel formation (below 30° C.) | Gel formation (at about 35° C.) |
| 1,2,4-Trimethylbenzene | Gel formation (at about 38° C.) | Gel formation (at about 38° C.) |
| Mesitylene | Gel formation (below 58° C.) | Gel formation (below 45° C.) |
| tert-Butylbenzene | Gel formation (below 44° C.) | Gel formation (at about 25° C.) |
| 1,2,3,5-Tetramethylbenzene | Gel formation (below 60° C.) | Gel formation (below 50° C.) |
| Anisole | no gel formation* | no gel formation* |
| o-Xylene | no gel formation* | no gel formation* |
| Toluene | no gel formation* | no gel formation* |
| 4-Methylanisole | no gel formation* | no gel formation* |

*no gel formation observed down to 0° C.
Notes:
Polymer A: PPV derivative as described in WO 99/24526, Polymer: Poly[(2-(3',4'-bis(2-methylpropyloxy)phenyl)-p-phenylenevinylene)co(2-(3',4'-bis(2-methylbutyloxy))phenyl)-5-methoxy-p-phenylenevinylene)co((2-(2,5-dimethylphenyl)-5-methoxy-p-phenylenevinylene]; $M_w$~1,000,000, $M_n$~310,000, see also FIG. 3.
Polymer B: PF derivative as described in WO 00/22026; Polymer of structure P2 (copolymer of 9-(4-(3,7-dimethyloctyloxy)phenyl)-9-(2,5-dimethylphenyl)fluorene-2,7-bisboronic acid bisglycol ester, 2,7-dibromo-9-(2,5-dimethylphenyl)-9-(4-(3,7-dimethyloctyloxy)phenyl)fluorene and 1 mol % of 4,4'-dibromotriphenylamine), although with a significantly increased molecular weight: $M_w$~720000, $M_n$~270000.

It can clearly be seen (FIG. 3) that various trimethylbenzenes and a tetramethylbenzene, like tert-butylbenzene, perform poorly as solvents for the polymers A and B. In contrast, solvents prepared using the solvent mixtures of the invention did not display these negative effects.

EXAMPLE 4

Drying of a Plurality of Solutions According to the Invention

Figure 4:
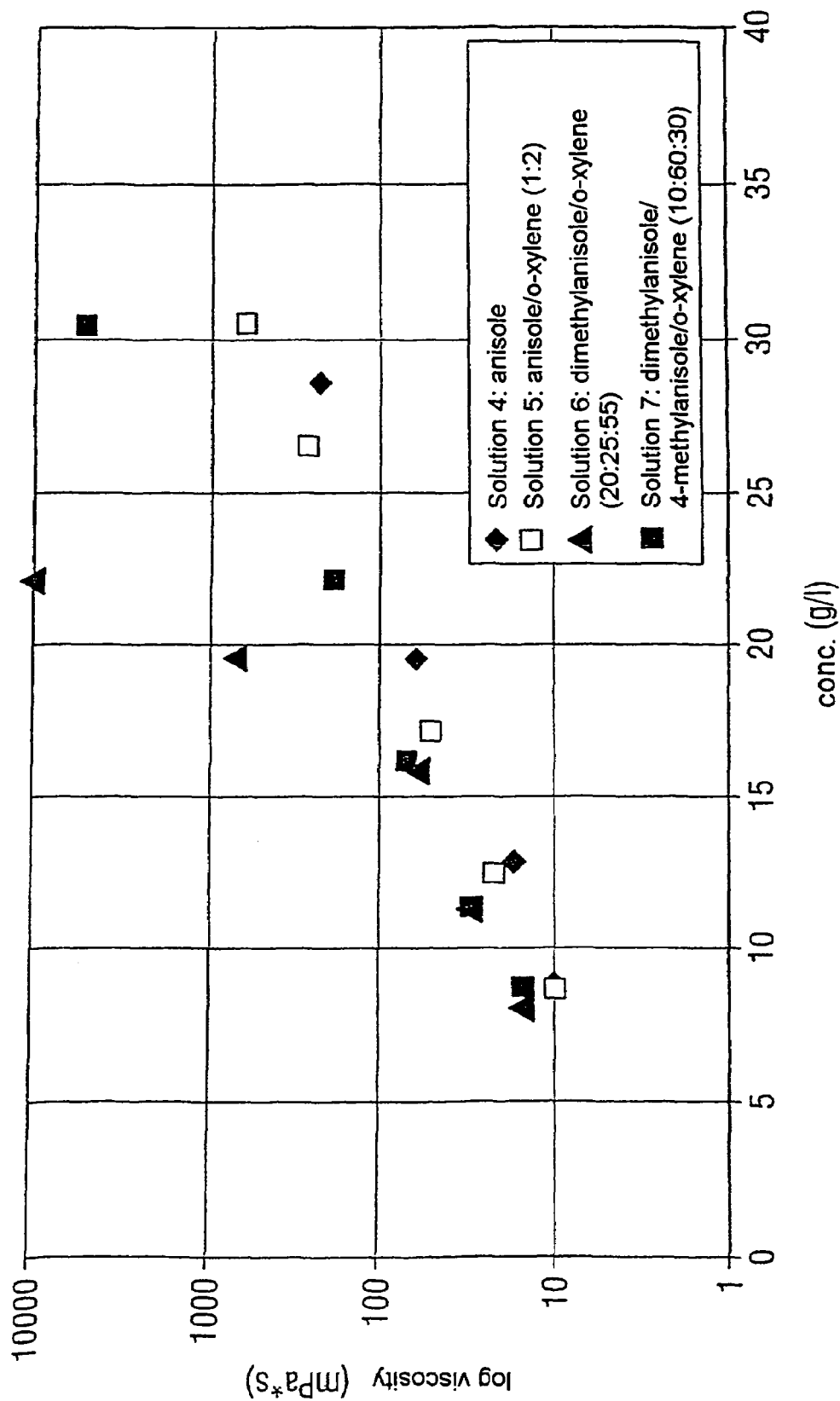
FIG. 4 illustrates the viscosity changes.

A plurality of solutions of the Polymer A in various solvents or solvent mixtures were prepared. The preparation of the solutions was carried out using a method analogous to that described in Example 2. The concentration of the solutions was in each case about 9 g/l. The solutions were adjusted so that the basic viscosity of the solutions was in each case approximately the same (about 8 to 15 mPa·s, at shear rates of 40 s$^{-1}$). Proportions of the solvent were then taken off from each of these solutions, and the new concentration (duplicate: once via UV/VIS, once mathematically via the amount of solvent taken off) and the associated viscosity was subsequently determined. The viscosity changes found are shown in FIG. 4.

Solutions in the following solvents were prepared:
Solution 4: Anisole
Solution 5: Anisole: o-xylene (v:v=1:2)
Solution 6: 2,5-Dimethylanisole: anisole: o-xylene (v:v:v=20:25:55)
Solution 7: 2,5-Dimethylanisole: 4-Methylanisole: o-xylene (v:v:v=10:60:30)

It can clearly be seen (from FIG. 4) that the solution 5 according to the invention and, even better, the solutions 6 and 7 according to the invention displayed significantly more rapid thickening compared with solution 0.4 which contained only one solvent.

This is, as indicated in the description, an important property for providing a technical solution to problems 3 to 5.

EXAMPLE 5

Drying of a Solution According to the Invention Containing a Polymer Blend

A solution (Solution 8) of the abovementioned polymers B and A ((Polymer B: Polymer A=95:5 [m:m]) in the solvent mixture 2,5-dimethylanisole: anisole: o-xylene (v:v:v=20:25:55) having a total polymer concentration of 9 g/l was prepared. This solution was prepared by a method analogous to that described in Example 2.

Two different tests were then carried out to evaluate the manner of drying of this polymer blend:

Firstly, fused silica plates were coated with the abovementioned blend by spin coating. Visually, the films produced in each case appeared clear and without any discernable structure. PL spectra were also recorded at 5 different points on each of 4 different specimens. These each displayed the same PL spectrum (that of Polymer A).

Small droplets of the solution (5-10 μl) were subsequently applied to glass supports and their drying was followed under a polarization microscope. No phase separation was found here.

EXAMPLE 6

Standard Method of Producing PLEDs for Test Purposes

LEDs were produced by the general method outlined below. This naturally had to be adapted in each individual case to take account of the particular circumstances (e.g. polymer viscosity and optimal layer thickness of the polymer in the device). In general, two-layer systems, i.e. substrate/ITO/conductive polymer/light-emitting polymer/cathode, were produced.

After the ITO-coated substrate (e.g. glass supports, PET film, or else complex substrates containing printed circuits for active matrix drive) had been brought to the correct size, they are cleaned, if this has not already been done before, in an ultrasonic bath in a plurality of cleaning steps (e.g. soap solution, Millipore water, isopropanol). They are dried by blowing with an N$_2$ gun and stored in a desiccator.

Before coating with the polymer layers, they are treated in an ozone plasma apparatus for about 20 minutes.

The appropriate solution or dispersion of the respective polymer is applied by means of a spin coater or applied by printing methods (e.g. IJP). The coating methods are preferably employed so that the conductive polymer layers have thicknesses in the range from 20 to 200 nm and the light-emitting polymer layers have thicknesses in the range from 50 to 100 nm.

Electrodes are also applied to the polymer films. This is generally achieved by thermal vapor deposition (Balzer BA360 or Pfeiffer PL S 500). The transparent ITO electrode is subsequently connected as the anode and the metal electrode (e.g. Ca, Yb, Ba, or electrodes consisting of a plurality of layers) is connected as the cathode and the device parameters are determined. On application of an appropriate voltage, holes from the anode and electrons from the cathode are injected into the device and these meet in the device and generate an excited state. This can return to a lower energy state with emission of light. This light is radiated out through the transparent anode.

The invention claimed is:

1. A solution or dispersion which comprises an undoped polymeric organic semiconductor in a solvent mixture of at least two different organic solvents, wherein
   A. Each of the solvents on its own has a boiling point of at least 100° C. and below 200° C. and a melting point of 15° C. or less,
   B. at least one of the solvents has a boiling point in the range from greater than 140 to less than 200° C.,
   C. the solvents used have no benzylic CH$_2$ or CH groups,
   D. the solvents used are not benzene derivatives containing tert-butyl substituents or more than two methyl substituents and
   wherein the solution or the dispersion comprises only solvents having a boiling point of at least 100° C. and wherein said polymeric organic semiconductor used is a substituted, soluble copolymer comprising structural units of at least two of the polymer classes selected from the group consisting of a soluble poly-p-arylene-vinylene (PAV), polyfluorenes (PFs), a soluble polyspiro-bifluorene (PSF), a soluble poly-para-phenylene (PPP), substituted, soluble polythiophene (PT), a substituted, soluble polypyridine (Ppy) and a substituted, soluble polypyrrole.

2. The solution or dispersion as claimed in 1, wherein the solvents used have no chloroform or tetrachloromethane.

3. A solution or dispersion as claimed in claim 1, wherein said solution or dispersion is a solution.

4. A solution or dispersion as claimed in claim 1, wherein said solution or dispersion is a dispersion.

5. A solution or dispersion as claimed in claim 1, wherein the organic semiconductor is a polymeric organic semiconductor.

6. A solution or dispersion as claimed in claim 5, wherein said solution or dispersion is a solution.

7. A solution as claimed in claim 6, wherein the polymeric organic semiconductor used is a soluble poly-p-arylene-vinylene (PAV).

8. A solution as claimed in claim 6, wherein the polymeric organic semiconductor used is a soluble polyfluorene (PF).

9. A solution as claimed in claim 6, wherein the polymeric organic semiconductor used is a soluble polyspirobifluorene (PSF).

10. A solution as claimed in claim 6, wherein the polymeric organic semiconductor used is a soluble poly-para-phenylene (PPP).

11. A solution as claimed in claim 6, wherein the polymeric organic semiconductor used is a substituted, soluble polythiophene (PT).

12. A solution as claimed in claim 6, wherein the polymeric organic semiconductor used is a substituted, soluble polypyridine (PPy).

13. A solution as claimed in claim 6, wherein the polymeric organic semiconductor used is a substituted, soluble polypyrrole.

14. A solution as claimed in claim 6, wherein the polymeric organic semiconductor used is a substituted, soluble copolymer comprising structural units of at least two of the polymer classes selected from the group consisting of a soluble poly-p-arylene-vinylene (PAV), a soluble polyspirobifluorene (PSF), a soluble poly-para-phenylene (PPP), substituted, soluble polythiophene (PT), a substituted, soluble polypyridine (Ppy) and a substituted, soluble polypyrrole.

15. A solution as claimed in claim 6, wherein the polymeric organic semiconductor used is a substituted or unsubstituted polyvinylcarbazole or a substituted or unsubstituted triarylamine polymer.

16. a solution or dispersion as claimed in claim 1, wherein the solution or the dispersion contains from 0.26 to 10% by weight of the organic semiconductor.

17. A solution or dispersion as claimed in claim 1, wherein the solution or the dispersion comprises solvents having different boiling points.

18. A solution or dispersion as claimed in claim 1, wherein the solution or the dispersion comprises one or more solvents selected from the group consisting of o-xylene, 2,6-lutidine, 2-fluoro-m-xylene, 3-fluoro-o-xylene, 2-chlorobenzotrifluoride, dimethylformamide, 2-chloro-6-fluorotoluene, 2-fluoroanisole, anisole, 2,3-dimethylpyrazine, 4-fluoroanisole, 3-fluoroanisole, 3-trifluoromethylanisole, 2-methylanisole, phenetole, 4-methylanisole, 3-methylanisole, 4-fluoro-3-methylanisole, 2-fluorobenzonitrile, 4-fluoroveratrole, 2,6-dimethylanisole, 3-fluorobenzonitrile, 2,6-dimethylanisole, 2,4-dimethylanisole, benzonitrile, 3,5-dimethylanisole, N,N-dimethylaniline, 1-fluoro-3,5-dimethoxybenzene and N-methylpyrrolidinone.

19. A solution or dispersion as claimed in claim 18, wherein the solution or the dispersion further comprises one or more solvents selected from the group consisting of 3-fluorobenzotrifluoride, benzotrifluoride, dioxane, trifluoromethoxybenzene, 4-fluorobenzotrifluoride, 3-fluoropyridine, toluene, 2-fluorotoluene, 2-fluorobenzotrifluoride, 3-fluorotoluene, pyridine, 4-fluorotoluene, 2,5-difluoro-toluene, 1-chloro-2,4-difluorobenzene, 2-fluoropyridine, 3-chlorofluorobenzene, 1-chloro-2,5-difluprobenzene, 4-chlorofluorobenzene, chlorobenzene, 2-chlorofluorobenzene, p-xylene and m-xylene.

20. A solution or dispersion as claimed in claim 1, wherein the solution or the dispersion comprises at least three different solvents.

21. A solution or dispersion as claimed in claim 20, wherein the three solvents have different boiling points.

22. A solution or dispersion as claimed in claim 20, wherein a first solvent having a boiling point in the range from 100 to 150° C., a second solvent having a boiling point in the range from 130 to 180° C. and a third solvent having a boiling point in the range from 170 to below 200° C. are used, with these solvents being different.

23. A layer of an organic semiconductor, wherein the layer is produced by means of a process which comprises applying by means of a printing process the solution or dispersion as claimed in claim 1.

* * * * *

UNITED STATES PATENT AND TRADEMARK OFFICE
CERTIFICATE OF CORRECTION

PATENT NO.        : 7,405,255 B2
APPLICATION NO.   : 11/345263
DATED             : July 29, 2008
INVENTOR(S)       : Hubert Spreitzer et al.

It is certified that error appears in the above-identified patent and that said Letters Patent is hereby corrected as shown below:

In Claim 16, in column 17, on line 34, "the solution or the dispersion contains from 0.26 to 10% by" should read -- the solution or the dispersion contains from 0.25 to 10% by --.

In Claim 18, in column 18, on line 8, "ethylanisole, 3-fluorobenzonitrile, 2,6-dimethylanisole, 2,4-" should read -- ethylanisole, 3-fluorobenzonitrile, 2,5-dimethylanisole, 2,4- --.

Signed and Sealed this

Sixteenth Day of September, 2008

JON W. DUDAS
*Director of the United States Patent and Trademark Office*